United States Patent [19]

Katsumata et al.

[11] Patent Number: 5,223,739
[45] Date of Patent: Jun. 29, 1993

[54] PLASTIC MOLDED SEMICONDUCTOR DEVICE HAVING WATERPROOF CAP

[75] Inventors: Akio Katsumata, Yokohama; Seiichi Hirata, Yokosuka; Shinetsu Fujieda, Kawasaki; Hiroshi Shimozawa, Yokohama, all of Japan

[73] Assignee: Kabushiki Kaisha Toshiba, Kawasaki, Japan

[21] Appl. No.: 581,700

[22] Filed: Sep. 13, 1990

[30] Foreign Application Priority Data

Sep. 14, 1989 [JP] Japan .................. 1-239471
Jun. 14, 1990 [JP] Japan .................. 1-155729

[51] Int. Cl.⁵ ................ H01L 23/28; H01L 25/04
[52] U.S. Cl. ................ 257/676; 257/666; 257/787; 361/421; 174/52.2
[58] Field of Search .............. 357/72, 84; 257/787, 257/796, 676, 666; 361/421; 174/522

[56] References Cited

U.S. PATENT DOCUMENTS

| | | | |
|---|---|---|---|
| 4,173,712 | 11/1979 | Purser | 357/84 |
| 4,814,943 | 3/1989 | Okuaki | 361/400 |
| 4,869,755 | 9/1989 | Huschka et al. | 136/259 |
| 4,942,454 | 7/1990 | Mori et al. | 357/70 |
| 4,953,002 | 8/1990 | Nelson et al. | 357/84 |

FOREIGN PATENT DOCUMENTS 2-62356  10/1990  Japan .................. 357/84

*Primary Examiner*—Rolf Hille
*Assistant Examiner*—David Ostrowski
*Attorney, Agent, or Firm*—Foley & Lardner

[57] ABSTRACT

A plastic molded semiconductor device having a semiconductor chip mounted on a die pad supported by hanging pins. The semiconductor chip is encapsulated by mold plastic where the semiconductor chip has a lead portion protruding to a side, and in which practically the entire periphery of the semiconductor chip is covered by aluminum or some other moistureproof material that stops the entry of moisture.

6 Claims, 5 Drawing Sheets

CHANGES IN PACKAGE MOISTURE ABSORPTION AMOUNT AT 85°C / 85 %

CHANGES IN PACKAGE SWELLING FOR GARDEN IMMERSION (215°C) (AFTER 168 HOUR AT 85°C/85%)

PLASTIC MOLDED SEMICONDUCTOR DEVICE HAVING WATERPROOF CAP

TECHNICAL FIELD

The present invention relates to a plastic molded semiconductor device and method for producing it, and, more particularly, to an optimum plastic molded semiconductor device and method for its manufacture in cases when surface mounting is used to simultaneously mount many semiconductor devices to substrates and the like, and the semiconductor chips each have a large surface area in a thin package.

Accompanying the development of technologies for mounting plastic molded semiconductor devices to substrates, there is an increasing need to use SOP (Small Outline Packages), QFP (Quad Flat Packages) and PLCC (Plastic Leaded Chip Carriers) and other types of semiconductor packages, for surface mounting.

On the other hand, the more sophisticated functions required of integrated circuits has lead to the production of semiconductor chips that have large semiconductor chip sizes of more than 10 mm².

However, the largest problem in such semiconductor packages for large-scale chip surface mounting is that, conventionally, since only the lead portion is heated, infrared reflow (IR) and vapor-phase reflow (VPS) and the like, cause direct heat shock to the entire semiconductor package. Thus, there is a problem of cracking and swelling when the semiconductor package absorbs moisture.

More specifically, in such a conventional, general type of plastic molded semiconductor device of the surface mounted type described above, as shown in FIG. 16, the semiconductor chip 2 is mounted on the upper surface of a die pad 1 that has hanging pins at each of the four corners. Supporting it, are bonding wires 4 between the inner leads 3a of each of the electrodes and each of the lead portions 3 of this semiconductor chip 2, The semiconductor chip 2 and the inner leads 3a are plastic molded in a mold plastic 5. This mold plastic 5 generally does not have any type of moistureproofing.

Because of this, when the entire semiconductor package is heated during mounting, moisture retained at the boundary surface of the die pad 1 and the mold plastic 5 is vaporized by the heat and as shown in the same diagram, causes the semiconductor package to swell and cause cracks.

Therefore, if cracking or swelling occurs in the semiconductor package, then not only is there a deterioration of the external appearance, but there is also a remarkable lowering of the moisture resistance reliability of the integrated circuit.

Because of this, it has been conventional practice for management of the concentration of the water component in semiconductor packages, to place a limit on the period of use after the opening of the aluminum laminate packaging or some other type of moistureproof packaging in which the semiconductor package was shipped, and to perform mounting by localized heating in those cases where mounting is not possible through heating of the entirety.

Also, there has been much literature relating to mechanisms that generate package cracks when there is high-temperature mounting, but with respect to this, (1) there is a strong correlation between the status and the length of storage of semiconductor packages, and the generation of package cracks, that is to say, the relationship between the status and the length of storage of semiconductor packages, and the amount of water absorbed by the mold plastic, (2) one of the phenomena prior to the generation of package cracks is the swelling of the mold resin surface as indicated in FIG. 16, and (3) cracking a semiconductor package and analyzing the gases that are generated from the entire package when it is heated shows that more than 95% is water.

From these facts, it is thought that the moisture component that is absorbed by the mold plastic condenses on the boundary surface between the mold plastic and the semiconductor chip or die pad, and under high temperatures, this moisture component is vaporized to apply a high pressure.

Preventing the generation of package cracking is one way of improving the high-temperature breaking strength of mold plastic, but the necessary plastic is still not available.

FIG. 17 uses the Fick dispersion equation to show the relationship between the concentration on the rear surface of the die pad, and the concentration for the entire package under conditions of moisture and no moisture for an 84-pin PLCC. From this figure, it can be seen that there is a strong correlation between the moisture concentration at the rear surface of the die pad and the package concentration, and this is thought to be the major cause of package cracking.

According to our experience in a package of an 84-pin PLCC, 10 mm² semiconductor chip, the moisture concentration on the rear surface of the die pad is about 600 ppm and it is assumed that this is the critical limit for the generation of cracks. In the case where a constant temperature of 25° C. and a constant humidity of 60% are assumed, then it will take approximately 800 hours for the moisture concentration on the rear surface of the die pad of this 84-pin PLCC, to reach 600 ppm.

Accordingly, even when moisture concentration of the package is controlled during mounting, a limit on the period of use is still necessary once the package is opened.

Because of this, Japanese Patent Application Laid-Open Publication No. 187652-1988 discloses an adhering foil or a plate to prevent moisture from passing through to the external surface of the mold resin, as one means of reducing the entry of moisture into the mold resin and of greatly reducing the amount of infrared absorption when there is infrared heating.

However, an adhesive is used at the boundary of the mold plastic with the foil or the resin in the disclosure in Japanese Patent Application Laid-Open Publication No. 187652-1988. There is not only the fear that the foil or plate will peel or flake off, but also the fear that moisture will enter into the molded plastic from the boundary between the molded plastic and the foil or the plate.

Furthermore, affixing the foil or plate increases the number of processes. Since the affixing is to prevent the entry of moisture into the semiconductor package, it must be implemented within a certain period after the completion of the molding processes. This degrades the workability and also causes problems of process management.

DISCLOSURE OF INVENTION

In the light of this, the present invention has as an object the provision of a plastic molded semiconductor device that when compared to normal molded plastic semiconductor devices for which moistureproofing processing has not been implemented, has an improved moisture resistance and workability and in which the concentration of moisture in the vicinity of the semiconductor chip or the rear surface of the die pad is greatly reduced when there is surface mounting.

In order to attain the object described above, the plastic molded semiconductor device according to the present invention is a plastic molded semiconductor device having a semiconductor chip mounted on the upper surface of a die pad that has hanging pins supporting it at each of its four corners, wherein the semiconductor chip is plastic molded with plastic, where the semiconductor chip has the lead portion protruding to the side and where the periphery of the semiconductor chip is covered with a moistureproof material monolithically fixed to the plastic. Another aspect of the present invention is the plastic molded semiconductor device described above, wherein practically the entire surface of the mold plastic is covered via insulating tape on the inside with a material that does not absorb moisture. Still another aspect of the present invention is the plastic molded semiconductor device described above, where a metal film with a favorable adhesion between said mold resin and surface of said mold resin is formed so that it does not contact the lead portion described above, and a metal film is laminated to the surface of this metal film.

In addition, the manufacturing method for the plastic molded semiconductor device according to the present invention has a semiconductor chip positioned and mounted internally to a pair of cup-shaped moistureproof materials, with the moistureproof material being disposed inside a cavity inside mold dies after the internal semiconductor chip has been mounted, and then injecting mold resin to inside the cavity of those mold dies and fixing the moistureproof material monolithically with the mold resin.

Another manufacturing method according to the present invention involves mounting a semiconductor chip on the upper surface of a die pad that has hanging pins supporting it, plastic molding the semiconductor chip with mold plastic in the position where the semiconductor chip has the lead portion protruding to the side, then electroplating the surface of the mold resin to form a non-electrolytic plate layer which is not in contact with the lead portion described above, then forming an electrolytic plate layer by electroplating the surface of the non-electrolytic plate described above.

Of a semiconductor device according to the present invention having the configuration described above, the periphery of the semiconductor chip is either covered by a moistureproof material or practically all of the surface area of a semiconductor chip is covered by moistureproof material with insulating tape in between, so that said moistureproof material positively stops moisture from entering into the mold resin, or the periphery of the semiconductor chip is covered by a metal film which positively stops moisture from entering into the mold resin, to thereby greatly reduce the moisture concentration in the vicinity of the semiconductor chip and the rear surface of the die pad during mounting.

By this, the moisture concentration in the vicinity of the semiconductor chip and, the rear surface of the die pad during mounting is eliminated and it is possible to prevent the generation of package cracks and swelling during mounting and also to eliminate of the moisture concentration inside the package, and the moistureproof packaging of the semiconductor chips prior to mounting.

In addition, in the case where a metal film is laminated, it is not only possible to obtain an external appearance the same as that of a metal product, but it is also possible to improve the characteristics for wear resistance and heat resistance, and to improve marking.

Furthermore, according to the manufacturing method of the present invention, it is possible to either surely fix a moistureproof layer to the mold plastic, or to form a metal film on the surface of the mold plastic without having to consider problems of the heat and moisture resistance of the adhesive, thereby making it possible to prevent the flaking off of the moistureproof material at high temperatures and high humidities, improve chip reliability and also improve the workability.

BEST MODES FOR CARRYING OUT THE INVENTION

The following is a description of embodiments of the present invention, with reference to the appended drawings.

Figure 1:
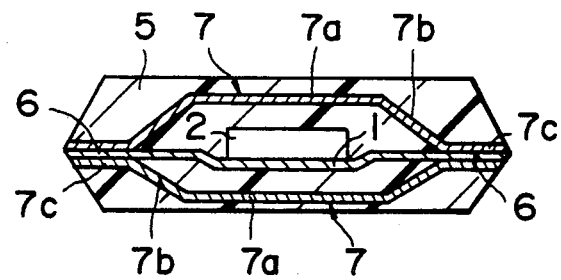
FIG. 1 is a sectional view between diagonally opposite corners of a first embodiment of a semiconductor device according to the present invention.
Figure 3:
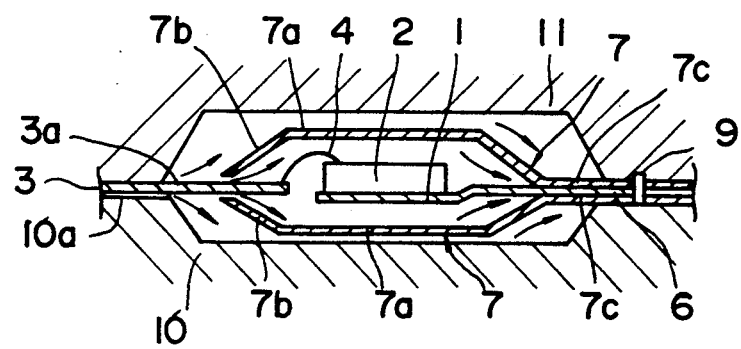
FIG. 3 is a sectional view showing mold processing, wherein the left side half is between diagonally opposite corners, and the right side half is along a centerline.

FIG. 1 shows a first embodiment of a semiconductor device according to the present invention, wherein a semiconductor chip 2 is mounted to an upper surface of a rectangularly shaped die pad 1 supported by hanging pins 6 extending radially to the four corners. The inner leads 3a of each of the lead portions and each of the electrodes of this semiconductor chip 2 are bonded by bonding wires 4 as shown in FIG. 3.

To the sides of the front surface and the rear surface of the semiconductor chip 2 described above, are disposed a pair of caps 7, 7 comprising an aluminum frame of moistureproof material. Each of these caps 7 is formed into a cup shape from a flat plate portion 7a of rectangular shape, and diagonal plate portions 7b, 7b that extend diagonally from each of the sides of the flat plate portion 7a, and four legs 7c extend horizontally in a radial direction from the connection portions of each of these diagonal plate portions 7b, 7b.

In the status where these legs 7c contact both the front and rear surfaces of the hanging pins 6 described above, the periphery of the semiconductor chip 2 is wrapped by the pair of caps 7, 7 and these caps 7, 7 are embedded into mold plastic 5.

In this manner, the periphery of the semiconductor chip 2 is covered by the caps 7, 7 of aluminum plate which is a moistureproof material, and the passing of moisture through the mold plastic 5 to reach the vicinity of the semiconductor cap 2 and the rear surface of the die pad 1 is surely interrupted by said cap 7, 7 so that it is possible to greatly reduce the moisture concentration in the vicinity of the semiconductor cap 2 and the rear surface of the die pad 1.

Figure 2:
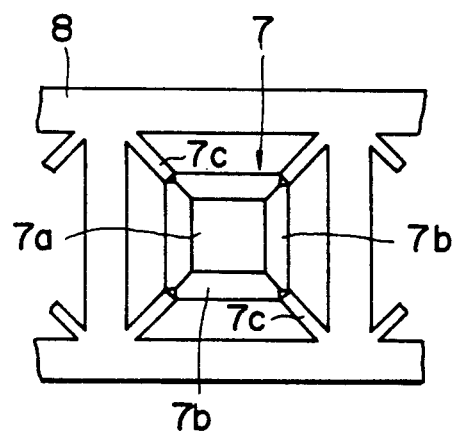
FIG. 2 is a plan view of an example of the structure of a cap.

The following is a description with reference to FIG. 2 and FIG. 3 which show an example of the structure of a cap.

First, as shown in FIG. 2, required the processing is implemented for the aluminum plate 8 of flat plate shape, and after a plural number of caps 7 have been continuously formed in the direction of its length, it is cut and separated at the distal ends of each of the leg portions 7c.

Then, the semiconductor chip 2 is mounted on the upper surface of the die pad 1 and wire bonding implemented and then the position is determined via the guide pin 9, for the status where each of the hanging pins that support the die pad 1 are held from the top and the bottom by the leg portions 7c, 7c of the pair of caps 7 described above.

When this is done, a gap can be made between the end surfaces of the diagonal plate portions 7b, 7b positioned above and below the caps 7, 7.

In this manner, where the front and rear surfaces of each of the hanging pins 6 of the semiconductor chip 2 are held between the leg portions 7c, 7c of the pair of caps 7, 7, an upper die 11 and a lower die 10 are closed around and mold plastic injected into the cavity between both portions 10, 11 of the die from a plastic injection opening 10a in the lower die 10.

When this is done, the mold plastic flows through the path shown by the arrows in FIG. 3. More specifically, the mold plastic flows to the top and bottom from one side of the caps 7, 7 and flows inwards from between the end surfaces of the diagonal plate portions 7b, 7b, and towards the rear of the caps 7, 7 so that mold plastic is filled inside the cavity of both dies 10, 11 to fix the caps 7, 7 in the status where they are embedded in mold plastic.

After this, the required post-processing is implemented and the semiconductor device is completed.

It is therefore not required to use an adhesive and therefore it is not necessary to consider problems concerning the temperature resistance and the moisture resistance of the adhesive, and it is possible to surely fix the caps 7, 7 inside the mold plastic 5 and to fix the caps 7, 7 during the molding process so that there are improvements in the reliability of moisture resistance and workability.

Figure 4:
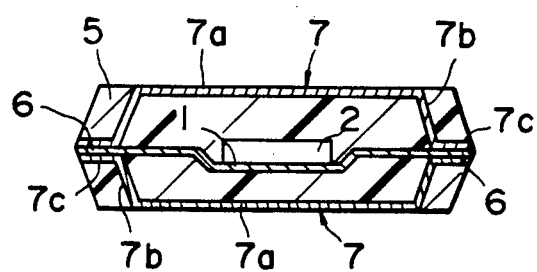
FIG. 4 through FIG. 7 are longitudinal sectional views modifications of the first embodiment.

FIG. 4 through FIG. 7 show examples of modifications of the first embodiment, with that shown in FIG. 4 being an example where the surfaces of the flat plate portions 7a, 7a of the aluminum plate caps of moistureproof material are exposed to the outside.

By exposing the surfaces of the flat plate portions 7a, 7a of the aluminum plate caps 7, 7 in this manner, it is possible to improve the moisture resistance and the heat dissipation characteristic of the package.

Figure 5:
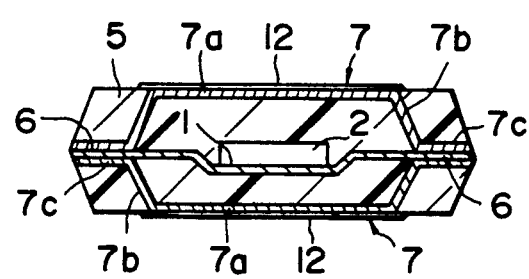

FIG. 5 shows the example shown in FIG. 4, in which the exposed flat plate portions 7a, 7a of the aluminum plate caps 7, 7 are covered with the insulation coating 12, 12 so as to improve the insulation effect of the package surface.

Moreover, instead of the insulation coating, it is also possible to affix insulation film (not indicated in the figure) of polyamide or the like.

Figure 6:
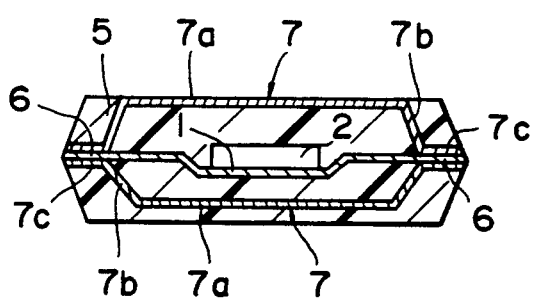
Figure 7:
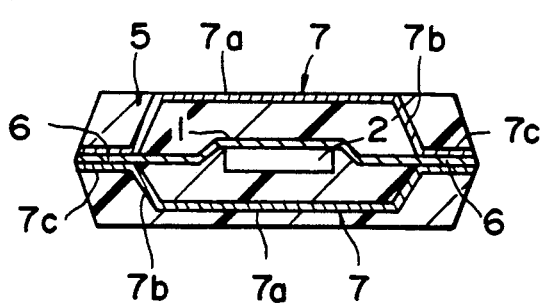

FIG. 6 shows an example in which one of the caps 7 on the side of the die pad 1 is embedded inside the mold plastic 5, while the surface of the flat plate portion 7a of the other cap 7 is exposed to the outside. FIG. 7 shows an example in which conversely, one of the caps 7 on the side of the semiconductor chip 2 is embedded inside the mold plastic 5, while the surface of the flat plate portion 7a of the other cap 7 is exposed to the outside so that both the insulation characteristic and the heat dissipation characteristic are improved.

Moreover, in the first embodiment described above, the caps 7, 7 are monolithically fixed with the mold plastic 5 when there is molding processing.

Figure 8:
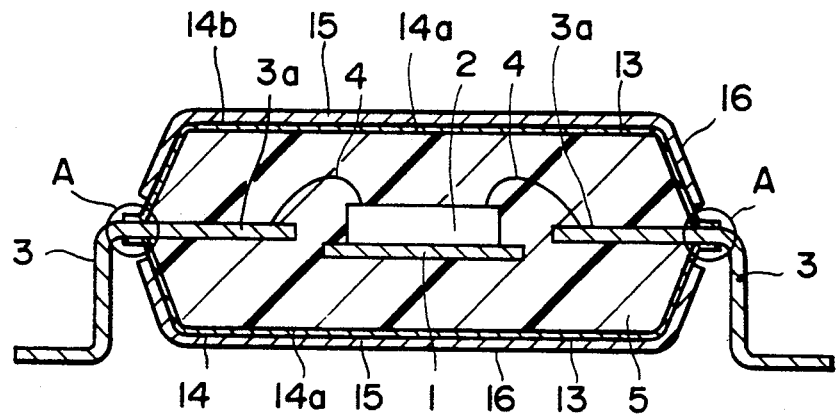
FIG. 8 is a longitudinal section of a second embodiment.
Figure 9:
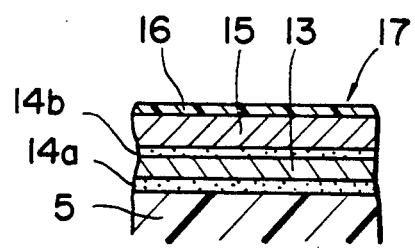
FIG. 9 is a partially enlarged view of FIG. 8.

FIG. 8 and FIG. 9 show a second embodiment according to the present invention, and in the same manner as for the first embodiment described above, a semiconductor chip 2 is mounted to an upper surface of a rectangularly-shaped die pad 1 that is supported by hanging pins extending from four corners in a radial direction. Each of the inner leads 3a of each of the lead portions and each of the electrodes of this semiconductor chip 2 are bonded by bonding wire 4. Furthermore, the semiconductor chip 2 and the inner leads 3a are encased by the mold plastic 5.

The entire surface of this mold plastic 5 is covered with polyamide film or some other type of insulation tape 13. This insulation tape 13 is affixed to the front surface of the mold plastic 5 using an adhesive 14a and in FIG. 8A, is connected by thermocompression bonding to the lead portion 3. Then, an adhesive 14b is used to affix an aluminum film 15 of moistureproof material and which extends to the vicinity of the lead portion 3.

In this manner, the insulation tape 13 between the surface of the mold plastic 5 and the aluminum film 15 of moistureproof material prevents the lead portions 3 from shorting because of the aluminum film 15, and also enables the maximization of the surface are to which the aluminum film is affixed. In addition, practically the entire periphery of the semiconductor chip 2 is covered via the insulation tape 13, by the aluminum film 15 of moistureproof material, so that this aluminum film 15 surely stops moisture from entering into the mold plastic 5, and enables a great reduction in the moisture concentration in the vicinity of the semiconductor chip 2 and the rear surface of the die pad 1 when there is mounting.

Furthermore, insulation coating 15 is implemented on this aluminum film 15 so that the substrate is more reliable.

Moreover, it is a matter of course that some other metallic material or glass or some other type of moistureproof material can be used in place of the aluminum film 15 described above as the moistureproof material.

The following is a description of an example of the manufacture of the second embodiment described above.

First, a semiconductor chip 2 is mounted to an upper surface of a lead frame die pad 1, and wire bonding implemented. Plastic molding is then performed with the mold plastic 5 and after, thereafter curing implemented, so that the characteristics of the mold plastic 5 are stabilized and the moisture component inside the mold plastic 5 is discharged.

As indicated in FIG. 9, an adhesive 14a is applied to the rear surface of the insulation tape 13 having a required size, an aluminum film 15, which is the moistureproof material, is affixed via the adhesive 14b at required positions on the surface, and adhesive tape 17, having an insulation coating 16, is prepared.

Then, adhesive tape 17 is affixed in the upwards and downwards directions on the surface of the mold plastic 5 and via the adhesive 14a and then, the insulation tape 13 and each of the lead portions 3 are connected by thermocompression bonding, as shown in FIG. 8 at region A.

After this, normal electroplate processing, cut and bond processing or other conventional post-processes are used to complete the semiconductor device.

Figure 10:
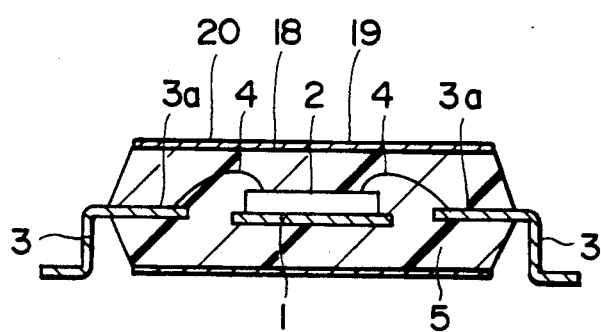
FIG. 10 is a longitudinal front elevational view of a third embodiment.
Figure 11:
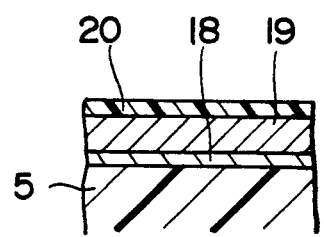
FIG. 11 is a partially enlarged view of FIG. 10.

FIG. 10 and FIG. 11 show a third embodiment according to the present invention. The portions that differ from the second embodiment described above are that instead of covering practically the entire surface of the mold plastic 5 with an aluminum film 15 (moistureproof material) via insulation tape 13, a metal film (non-electrolytic plate layer) 18 comprising a 0.2 μm thick nickel film having a favorable adhesive characteristic with the mold plastic 5 is formed on the upper and lower flat surfaces of the surface of the aluminum film 15, and the surface of this metal film 18 is laminated with a metal film (electrolytic plate layer) 19 comprising copper to a thickness of about 3 μm and a nickel film to a thickness of about 5 μm, and the surface of this nickel film 19 is covered with an insulation film 20 comprising polyamide to provide an insulation effect with respect to the substrate.

In this manner, the upper and lower flat surfaces of the semiconductor chip 2 are covered with a metal film 19 that positively interrupts the entry of moisture to the inside of the mold plastic 5, so that it is possible to greatly reduce the moisture concentration in the vicinity of the semiconductor chip 2 and the rear surface of the die pad 1 during mounting, and it is also possible to improve the heat dissipation characteristic of the package.

Moreover, as has been described above, the successive lamination of the metal film 18 and the metal film 19 for other than the upper and lower flat surfaces of the mold plastic 5, that is to say, for other than the diagonal end surfaces that protrude acutely towards the rear, prevents the shorting of each of the leads 3 by the presence of the metal film 18 between.

The following is a description of an example of the manufacture of this third embodiment.

First, a resist is applied and the lead portion 3 protected in order to prevent the metal film 18 from being formed on the diagonal end surfaces described above. After hardening for example, this resist changes to a (protective) film so that the non-electrolytic plate does not stick to these end surfaces in the non-electrolytic plating process described below.

Figure 13:
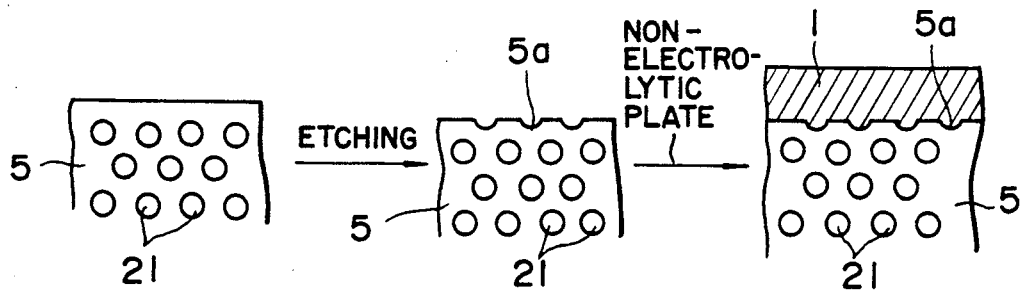
FIG. 13 a sectional view showing the order of processing up to the roughening of the surface and the formation of the electroplate layer.

Wet etching is then implemented in order to roughen the surfaces of the exposed portions of the mold plastic 5. This etching is a basic process in order to ensure adhesion with the metal film 18. A mixed liquid of sulfuric acid and chromic acid is normally used as the etchant. As shown in FIG. 13, the implementation of this etching removes oil and other unwanted matter that has attached to the surface of the mold plastic 5 and also enables an uneven surface 5a having feelers 21 to be produced on the mold plastic 5 so that good adhesion with the metal film 18 is ensured.

Following this is the catalytic granting process for the creation of the catalytic nucleii (Pd, Ag, Au, etc.) necessary for the non-electrolytic plating described below. In this plating, after etching with the catalyst liquid (such as $PdCl_2$ 0.1–0.4 g/l, $SnCl_2$ 5–30 g/l, 36% HCl 100–300 ml), the semiconductor is immersed and water washed and the processed with accelerator liquid (such as $H_2SO_4$ 50–150 g/l) to form the Pd catalytic nucleii by the following reaction:

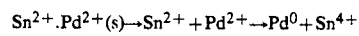

$$Sn^{2+} \cdot Pd^{2+}(s) \rightarrow Sn^{2+} + Pd^{2+} \rightarrow Pd^0 + Sn^{4+}$$

Moreover, it is a matter of course that the Pd spatter method or some other type of dry method can be used for the formation of these catalytic nucleii.

The surface of the mold plastic 5 which has nucleii formed in this manner then has a metal film (non-electrolytic layer) of 0.2 μm to 1.0 μm thickness formed on it by non-electrolytic copper plating or non-electrolytic nickel plating or the like. In the embodiment shown in FIG. 10 and FIG. 11, a nickel film of 0.2 μm is formed, but this has been formed by immersing a semiconductor device for which nucleii have been applied to the mold plastic described above, in a non-electrolytic nickel plating liquid.

After this, in order to improve each of the functions and the external appearance as a semiconductor device, normal electroplating is implemented using copper, nickel or chrome or the like, and the metal layer (electroplating layer) 19 on the upper surface of the metal film 18 described above is formed to a film thickness of 10 to 50 μm in accordance with the purpose of use. In the embodiment shown in FIG. 10 and FIG. 11, the 3 μm thick copper film and the 2 μm thick nickel film configure this metal layer (electrolytic plate layer). Both the material and the thickness can be changed in accordance with the purpose.

The resist that has been applied to the end surfaces of the mold plastic described above is then removed (to remove the protective film) and then, the metal layer 19 is covered with insulation film 20. The semiconductor device is completed with post processing, as described above.

Moreover, a polyamide film is used as the insulation film 20, but for an insulation effect with respect to the substrate, the surface area, the material the thickness, and other characteristics can be changed.

Figure 12:
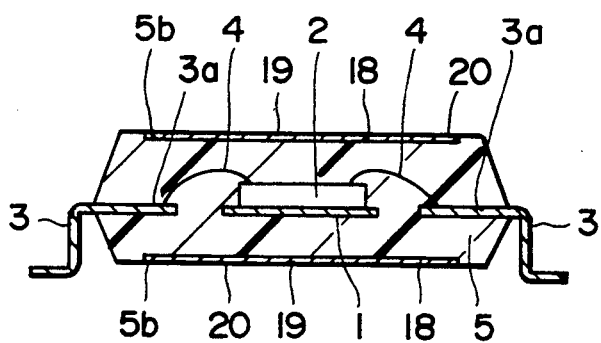
FIG. 12 shows modifications of the third embodiment of FIG. 10.

As shown in FIG. 12, practically the entire area of the upper and lower flat regions of the mold plastic 5 has uneven portions 5b formed over it, In the same manner as described above, the metal film (non-electrolytic plate layer) 18 and the metal film (electrolytic plate layer) 19 are successively laminated into these uneven portions 5b. The surface of the metal film 19 is covered by insulation film 20, to prevent the flaking of metal film 18 and 19.

Figure 14:
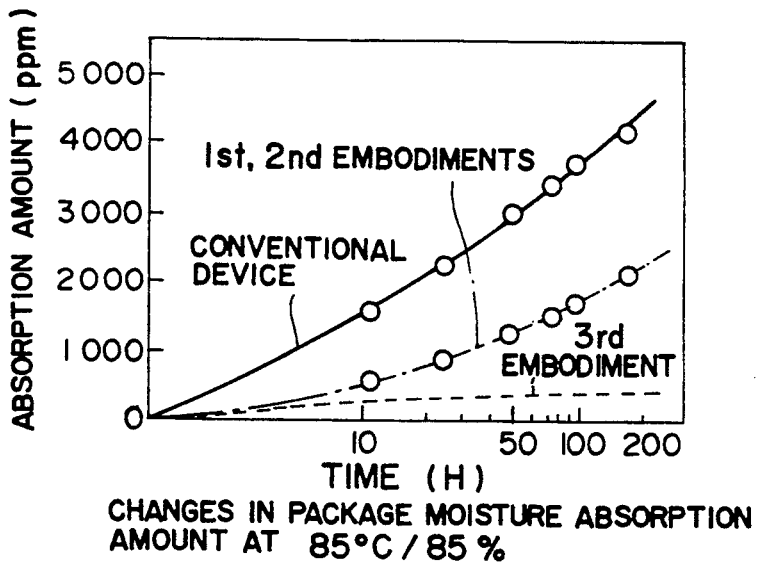
FIG. 14 is a graph showing the status of changes in the amounts of moisture absorbed by a package according to the present invention, at 85° C. and 85% humidity.
Figure 15:
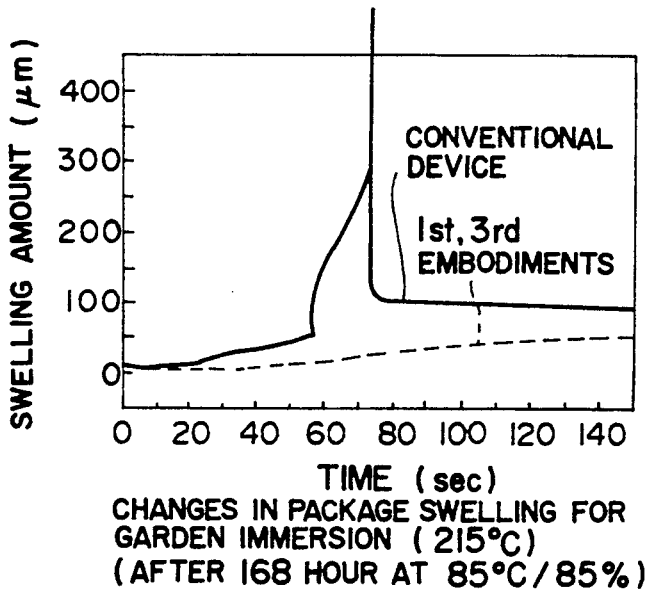
FIG. 15 is a graph showing changes in the amount of swelling of the same package undergoing Gundell immersion (215° C.)
Figure 16:
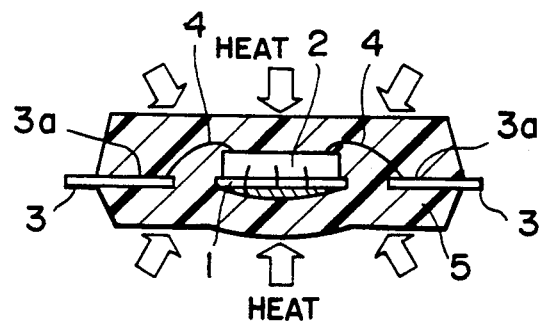
FIG. 16 is a longitudinal sectional view of a conventional semiconductor package.
Figure 17:
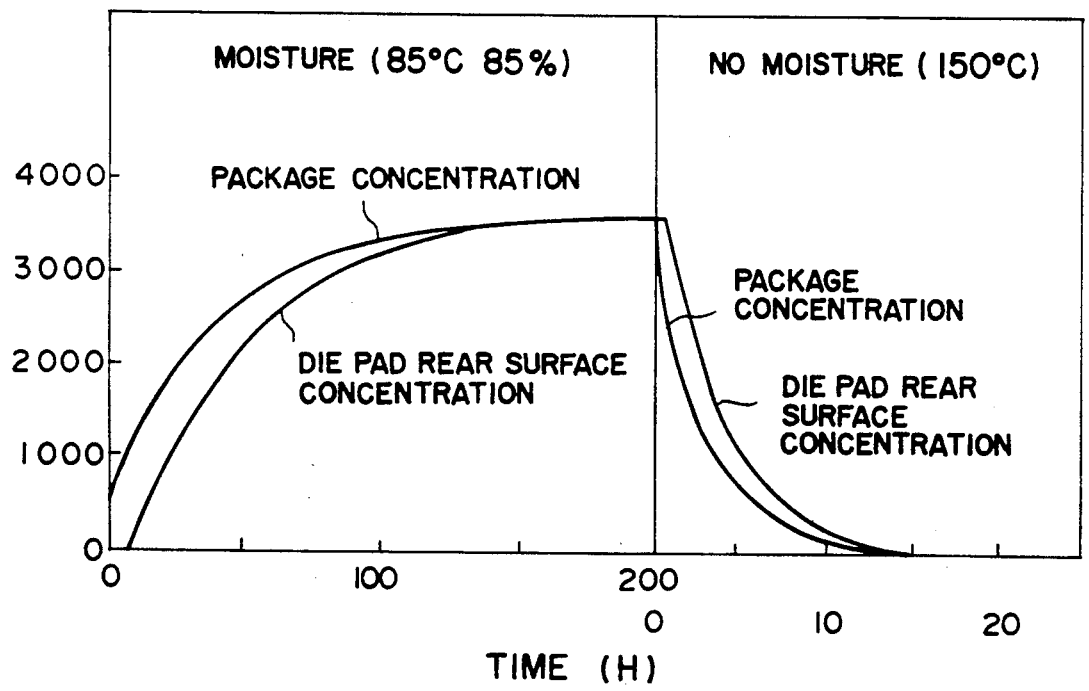
FIG. 17 is a graph showing the relationship between the moisture concentration on the rear of the die pad, and that of the semiconductor package for both when there is moisture and when there is not.

FIGS. 14 and 15 show a comparison of the effect of a conventional semiconductor device indicated in FIG. 16, and each of the embodiments of the present invention and indicated in FIGS. 1 to 3.

FIG. 14 shows the change in the semiconductor package absorption amount under moisture conditions of a temperature of 85° C. and a humidity of 85%. In this figure, the solid line shows the change in the moisture absorption amount for the normal, conventional package shown in FIG. 16, and the single dotted line shows the change in the moisture absorption amount for the packages according to the first and second embodiments in FIG. 1 and FIG. 8, respectively. The broken line shows the change in moisture absorption amount for the package according to the third embodiment, shown in FIG. 10.

As is clear from the diagrams, in the semiconductor package according to the first, second and third embodiments, there is a great reduction in the package absorption amount when compared to the conventional package.

FIG. 15 shows the amount of swelling of a 184-pin QFP semiconductor package mounted with 15 mm² semiconductor chips, that has undergone Gardell immersion at 215° C. after moisture has been applied for 168 hours at 85° C. temperature and 85% humidity. The solid line shows the change in the amount of swelling for the conventional package shown in FIG. 16, while the broken lines show the changes in swelling amount for the package according to the first and third embodiments.

As is clear from the figure, package cracks generally occur after approximately 60 seconds, in the case of a conventional package. Package cracks still do not occur after 140 seconds in the case of the package according to the present invention.

The following table shows the results of tests conducted to investigate the internal crack generation conditions after VPS (vapor phase soldering) was performed under various temperature and moisture conditions with respect to a 184-pin QFP semiconductor package mounted with 15 mm² semiconductor chips, manufactured in accordance with a conventional device, and the above described first, second and third embodiments.

TABLE

| moisture conditions | conventional device | 1st, 2nd, 3rd embodiments |
|---|---|---|
| 85° C./85% × 24H | 10/10 | 0/10 |
| 85° C./85% × 48H | 10/10 | 0/10 |
| 85° C./85% × 72H | 10/10 | 0/10 |
| 85° C./85% × 96H | 10/10 | 0/10 |
| 85° C./85% × 168H | 10/10 | 0/10 |

Package: QFP 184-pin: 15 mm² semiconductor chip
VPS conditions: 215° C. × 1 min: twice According to this table, internal cracking occurs after the elapse of 24 hours under moist conditions at 85° C. and 85% humidity in the case of the conventional device. No internal cracking occurs even after the elapse of 168 hours under the same conditions of 85° C. and 85% humidity in the case of the first, second and third embodiments.

We claim:

1. A plastic-encapsulated semiconductor device comprising:
    a die pad having a rectangular shape;
    a semiconductor chip mounted on said die pad and having a plurality of electrodes;
    a plurality of lead portions, each of which is electrically connected to one of said plurality of electrodes of said semiconductor chip via a bonding wire and having an inner lead;
    a mold plastic in which said semiconductor chip and each inner lead of said portions are encapsulated by molding; and
    a cap formed as a pair of moisture proof parts, each part of which is formed in a cap-shape, consisting of a flat portion and slant members and which are disposed at positions for surrounding upper and lower surfaces of said semiconductor chip, and are fixed to said mold plastic in a manner so that at least said slant portions are buried in said mold plastic, so that an inner portion between said parts is filled by said mold plastic.

2. A plastic-encapsulated type of semiconductor device comprising:
    a die pad having a rectangular shape;
    a semiconductor chip mounted on said die pad and having a plurality of electrodes; 'a plurality of lead portions, each of which is electrically connected to one of said electrodes of said semiconductor chip via a bonding wire and having an inner lead;
    a mold plastic in which said semiconductor chip and each inner lead of said lead portions are encapsulated by molding;
    a first metal layer having good adhesion to said mold plastic formed on the upper and lower surfaces of said mold plastic by means of non-electrolytic plating, so that said metal layer is not in contact with said lead portions; and
    a second metal layer laminated by electrolytic plating onto the surface of said first metal layer.

3. A plastic molded semiconductor device of claim 1, wherein a pair of aluminum caps are used as said moistureproof material.

4. The plastic molded semiconductor device of claim 3, wherein at least one surface of aid pair of caps is exposed to the outside.

5. The plastic molded semiconductor device of claim 4, wherein insulation coating is implemented for a surface of said cap, the surface of which is exposed to the outside.

6. The plastic molded semiconductor device of claim 1, wherein aluminum film is used as said moistureproof material.

* * * * *